(12) United States Patent
Fumitake

(10) Patent No.: US 8,716,764 B2
(45) Date of Patent: May 6, 2014

(54) SEMICONDUCTOR DEVICE AND MANUFACTURING METHOD THEREOF

(71) Applicants: Semiconductor Manufacturing International Corporation (Shanghai), Shanghai (CN); Semiconductor Manufacturing International Corporation (Beijing), Beijing (CN)

(72) Inventor: Mieno Fumitake, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/897,171

(22) Filed: May 17, 2013

(65) Prior Publication Data

US 2013/0248946 A1    Sep. 26, 2013

Related U.S. Application Data

(62) Division of application No. 13/552,446, filed on Jul. 18, 2012, now Pat. No. 8,518,781.

(30) Foreign Application Priority Data

Nov. 24, 2011    (CN) .......................... 2011 1 0377035

(51) Int. Cl.
*H01L 27/098* (2006.01)
(52) U.S. Cl.
USPC ........ 257/274; 257/403; 257/E21.4; 438/188; 438/194; 438/282

(58) Field of Classification Search
CPC ........................... H01L 27/098; H01L 29/785
USPC ............. 257/274, 403, E21.4; 438/188, 194, 438/276, 282, 283
See application file for complete search history.

(56) References Cited

U.S. PATENT DOCUMENTS

| | | | |
|---|---|---|---|
| 6,376,617 B1 | 4/2002 | Angelucci et al. | |
| 6,525,403 B2* | 2/2003 | Inaba et al. | 257/618 |
| 7,508,031 B2 | 3/2009 | Liu et al. | |
| 7,521,301 B2 | 4/2009 | Lee et al. | |
| 7,531,437 B2 | 5/2009 | Brask et al. | |
| 7,678,652 B2 | 3/2010 | Tsuchiaki | |
| 7,910,413 B2 | 3/2011 | Zhu | |
| 7,944,003 B2 | 5/2011 | Ban et al. | |
| 2006/0231907 A1 | 10/2006 | Kim et al. | |
| 2011/0042748 A1 | 2/2011 | Anderson et al. | |
| 2012/0217467 A1* | 8/2012 | Tan et al. | 257/9 |

* cited by examiner

*Primary Examiner* — Cheung Lee
*Assistant Examiner* — Stephen Bradley
(74) *Attorney, Agent, or Firm* — Innovation Counsel LLP

(57) ABSTRACT

A semiconductor device and a manufacturing method thereof are provided. The fin semiconductor device includes a fin formed on a substrate and an insulating material layer formed on the substrate and surrounding the fin. The fin has a semiconductor layer that has a source region portion and a drain region portion. The fin includes a first channel control region, a second channel control region, and a channel region between the two channel control regions, all of which are positioned between the source region portion and the drain region portion. The two channel control regions may have the same conductivity type, different from the channel region.

9 Claims, 19 Drawing Sheets

SEMICONDUCTOR DEVICE AND MANUFACTURING METHOD THEREOF

CROSS-REFERENCE TO RELATED APPLICATIONS

This is a divisional of U.S. application Ser. No. 13/552,446, filed on Jul. 18, 2012, which application claims the benefit of and priority to Chinese Patent Application No. CN201110377035.3 filed on Nov. 24, 2011 and entitled "Semiconductor Device and Manufacturing Method Thereof", each of which is incorporated herein by reference in their entireties.

FIELD OF THE INVENTION

The present invention relates to the field of semiconductor technology, and more specifically, relates to a semiconductor device and a manufacturing method thereof.

DESCRIPTION OF THE RELATED ART

With continuous development of semiconductor technology, critical dimensions of a device are continuously shrinking. Under such trend, a MOS semiconductor device, such as a CMOS transistor, has been proposed.

However, as the CMOS semiconductor device technology advances, the fabrication process has become more complex. Thus, FinFET gradually becomes a desirable alternative for MOSFET because of its simple fabrication process.

There exists a need for fin JFET as well as manufacturing method thereof. To this end, the inventor proposes a novel semiconductor device and a manufacturing method thereof.

SUMMARY

Generally, the increasing requirements on fin dimension can be relaxed if the carrier mobility of the device is enhanced.

In one aspect, the present disclosure enhances carrier mobility of the fin semiconductor device so that the requirements on device dimension can be more relaxed.

According to an aspect of the present disclosure, there is provided a fin semiconductor device, comprising: a fin including a semiconductor layer formed on a substrate; and an insulating material layer formed over the substrate and surrounding the fin, the insulating material layer having a thickness less than the thickness of the semiconductor layer; wherein, the semiconductor layer has: a source region portion and a drain region portion formed on the insulating material layer; a first channel control region, a second channel control region and a channel region between the source region portion and the drain region portion. The first channel control region is formed at a center of the semiconductor layer away from the edge and has a first conductivity type; the second channel control region is formed along an edge of the semiconductor layer in a portion of the semiconductor layer is not covered by the insulating material layer, the second channel control region having the first conductivity type; the channel region is between the first channel control region and the second channel control region; and the channel region adjoins the source region portion and the drain region portion, the channel region, the source region portion, and the drain region portion having a second conductivity type which is opposite to the first conductivity type.

The semiconductor device may also include: a gate for the fin, the gate adjoining the second channel control region, wherein the gate is formed on the insulating material layer.

The first channel control region may have a lower portion and an upper portion extending from the lower portion, wherein the lower portion is below the upper surface of the insulating material layer.

The fin may include a hard mask on the semiconductor layer.

A ratio of the thickness, T, of the insulating material layer to the difference between the height, Hsemi, of the semiconductor layer and the thickness T, that is, T/(Hsemi−T), may be about 3-5.

The second channel control region may extend below the upper surface of the insulating material layer.

The substrate may have a region adjoining the first channel control region and having a conductivity type opposite to that of the channel region, so as to provide power for the first channel control region.

The semiconductor device may include gate spacers located on two sides of the gate that are adjacent to the source region portion and the drain region portion.

The semiconductor device may include two or more of the fins, wherein the two or more of the fins comprise a first fin and a second fin, and wherein the conductivity type of the channel region included in the first fin is same as or opposite to the conductivity type of the channel region included in the second fin.

According to another aspect of the present disclosure, there is provided a method of manufacturing a semiconductor device, comprising: providing a substrate with a fin formed thereon, wherein the fin has a semiconductor layer formed of a semiconductor material having a first conductivity type; forming, over the substrate, a first insulating material layer surrounding the fin, wherein, the first insulating material layer has a thickness less than the thickness of the semiconductor layer; introducing, into an exposed surface of the semiconductor layer, a first dopant that can impart a second conductivity type which is opposite to the first conductivity type, such that a first region having the second conductivity type is formed at least in the exposed surface of the semiconductor layer in a portion of the fin that is not covered by the first insulating material layer, wherein, the portion of the semiconductor layer other than the first region serves as a second region, the second region having the first conductivity type; forming a dummy gate for the fin to enclose a portion of the fin that corresponds to a channel region to be formed, wherein the dummy gate is formed above the first insulating material layer; forming a second insulating material layer on the substrate to cover a portion of the fin other than the top surface of the dummy gate; removing the dummy gate to expose a portion of the first region in the fin that is enclosed by the dummy gate; and forming a third region having the first conductivity type in the first region by introducing into the surface of the exposed portion of the first region wherein, the portion of the first region other than the third region is the channel region, the channel region separating the second region from the third region and having the second conductivity type, and wherein, the second region is used for providing a first channel control region for controlling the channel region, and the third region functions as a second channel control region for controlling the channel region.

The method may include forming a hard mask on the semiconductor layer.

The method may include: after forming the dummy gate but before forming the second insulating material layer, forming a spacer for the dummy gate, and wherein, the formed second insulating material layer also substantially covers the spacer.

The method may also entail: after forming the spacer but before forming the second insulating material layer, implanting to form a source region portion and a drain region portion in the semiconductor layer that adjoin the channel region, the source region portion and the drain region portion has a conductivity type as same as that of the channel region, wherein, the first channel control region in the second region is adjacent to said source region portion and the drain region portion and is between the source region and the drain region.

The method may also entail: after introducing the second dopant, forming a gate for the fin, the gate adjoins the second channel control region from an outer side of the second channel control region, wherein the gate is formed above the first insulating material layer.

The method may also entail: after forming the gate, forming a spacer for the gate.

The method may also entail: after forming the spacer, epitaxially growing a semiconductor material from the exposed surface of the semiconductor layer.

The method may also entail: implanting to form a source region portion and a drain region portion in the semiconductor layer that adjoin the channel region, the source region portion and the drain region portion having a conductivity type that is the as same as that of the channel region, and wherein, the first channel control region in the second region is adjacent to the source region portion and the drain region portion and is between the source region portion and the drain region portion.

In the method, a ratio of the thickness, T, of the insulating material layer to the difference between the height, Hsemi, of the semiconductor layer and the thickness T, that is, T/(Hsemi−T), may be 3-5.

In the method, the substrate may have two or more of the fins formed thereon, wherein the two or more of the fins comprise a first fin and a second fin, and wherein the conductivity type of the channel region in the first fin is same as or opposite to the conductivity type of the channel region in the second fin.

In the method, the conductivity type of the channel region of the first fin may be opposite to the conductivity type of the channel region of the second fin. In such case, the first/second dopant may be introduced by: covering the first fin with a first mask and exposing the second fin, introducing a corresponding dopant into the second fin; removing the first mask; and covering the second fin with a second mask and exposing the first fin, and introducing a corresponding dopant into the first fin.

Further features of the present invention and advantages thereof will become apparent from the following detailed description of exemplary embodiments according to the present disclosure with reference to the accompanying drawings.

BRIEF DESCRIPTION OF THE DRAWINGS

The accompanying drawings, which are incorporated in and constitute a part of the specification, illustrate exemplary embodiments of the disclosure and, together with the description, serve to explain the principles of the disclosure. The present invention can be more clearly understood by reading the following detailed description with reference to the accompanying drawings, in which.

Figure 1A:
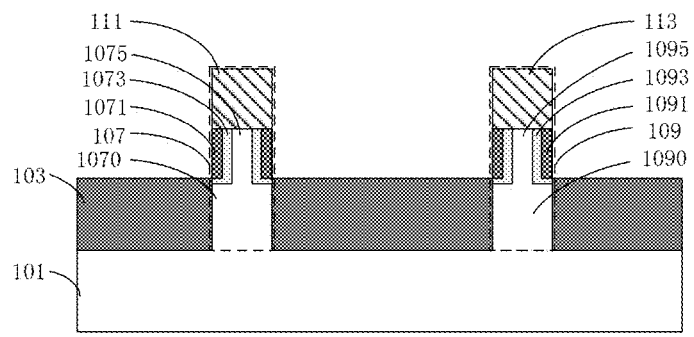
FIGS. 1A, 1B and 1C are schematic cross-sectional diagrams showing a semiconductor device according to one embodiment of the present disclosure.

It should be understood that the drawings are merely illustrative in nature and are not intended to limit the scope of the present invention. In the drawings, various components are not necessarily drawn to scale or according to their actual shapes, and some of the components (e.g., layers or parts) maybe enlarged relative to others so as to more clearly explain the principles of the present invention. For simplicity and clarity, details of well-known features and techniques are not shown in the drawings to avoid unnecessarily obscuring.

DESCRIPTION OF THE EMBODIMENTS

Hereinafter, embodiments of the present disclosure will be described with reference to the accompanying drawings.

FIG. 1A shows a semiconductor device 100A according to one embodiment of the present disclosure. The semiconductor device 100A comprises a substrate 101 on which one or more fins (such as fins 107 and 109, as indicated in the dotted block of FIG. 1) are formed. Herein, in one embodiment, the substrate can be a bulk substrate, such as a bulk silicon substrate.

An insulating material layer (a first insulating material layer) 103 is also formed over the substrate 101 to surround the fins 107 and 109 so as to support the fins. In one embodiment, the insulating material layer 103 has a thickness that is less than the thickness of the fins. More preferably, a ratio of the thickness T of the insulating material layer 103 to the difference between the height Hsemi of the semiconductor layer 1070/1090 and the thickness T of the insulating material layer 103 is about 3-5, that is, T/(Hsemi−T)=3-5 (see FIG. 16). However, it should be understood that this is not a limitation of the present disclosure and a larger or smaller ratio can be used, so long as the insulating material layer can provide support for the fins.

In the device 100A according to this embodiment, the fin 107 has a semiconductor layer 1070 (first semiconductor layer) formed of a semiconductor material and a hard mask 111 over the semiconductor layer 1070, as indicated by the dashed line wrapped blocks of FIGS. 1A-1C, FIGS. 2A-2C, and FIG. 16.

Figure 10A:
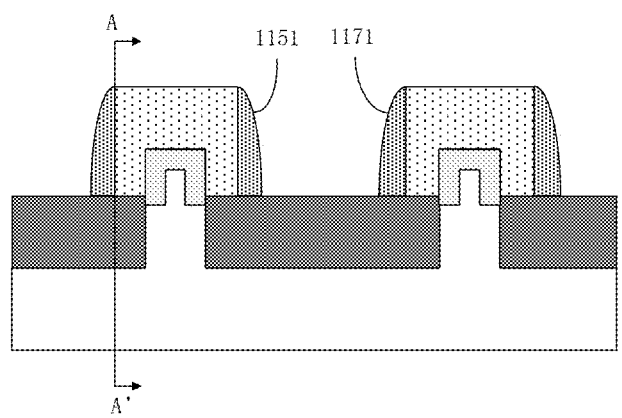
Figure 10B:
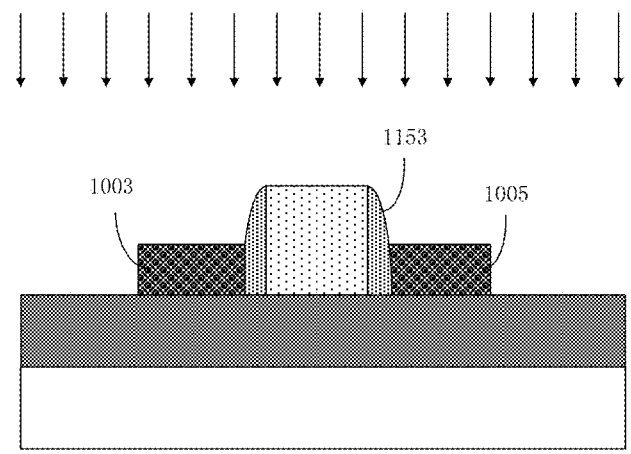

The semiconductor layer 1070 has a source region portion 1003 and a drain region portion 1005 (not shown in FIG. 1A, but can be seen in FIG. 10B), and a first region 1701 (see FIG. 17), a second region 1075 (see FIG. 1A and FIG. 17) and a third region 1071 (see FIG. 1A and FIG. 22) between the source region portion 1003 and the drain region portion 1005 (in FIG. 10B). As would be understood from the description hereunder, the source region portion 1003 and the drain region portion 1005 can be at least a portion of a source region and a portion of a drain region, respectively.

The first region 1701 is formed in the surface of the semiconductor layer 1070 in the portion of the fin 107 that is not covered by the insulating material layer 103. As would be more easily understood from FIG. 17, in the case where the fin comprises the hard mask 111 over the semiconductor layer, the first region 1701 is formed in the exposed surface (i.e. the surface that is not covered by the insulating material layer 103 and the hard mask 111) of the semiconductor layer 1070.

Figure 2A:
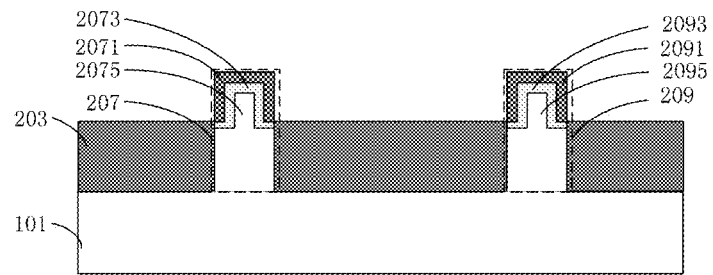
FIGS. 2A, 2B and 2C are schematic cross-sectional diagrams showing a semiconductor device according to one embodiment of the present disclosure.
Figure 2B:
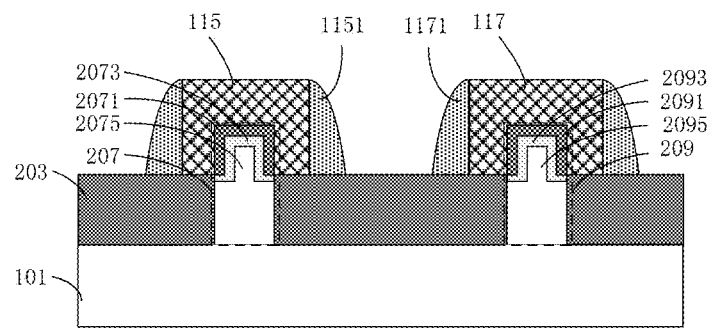

In addition, according to some other embodiments of the present disclosure, the fin has no hard mask. In this case, the fin itself is formed of a semiconductor layer, as shown in FIGS. 2A and 2B. In such a case, a portion of the surface of the semiconductor layer in the fin is covered by the insulating material layer, and the first region is formed on the exposed surface (i.e. a surface that is not covered by the insulating layer 203) of the semiconductor layer.

Depending on the methods for forming the first region 1701 in the exposed surface of the semiconductor layer 1070, the lower end of the first region 1701 can extend into the semiconductor layer 1070 below the lower surface of the insulating material layer 103. This is also embraced within the scope of the present disclosure.

Thus, in the present disclosure, the first region can be formed in the exposed surface of the first semiconductor layer in the portion of the fin that is not covered by the first insulating material layer.

Figure 17:
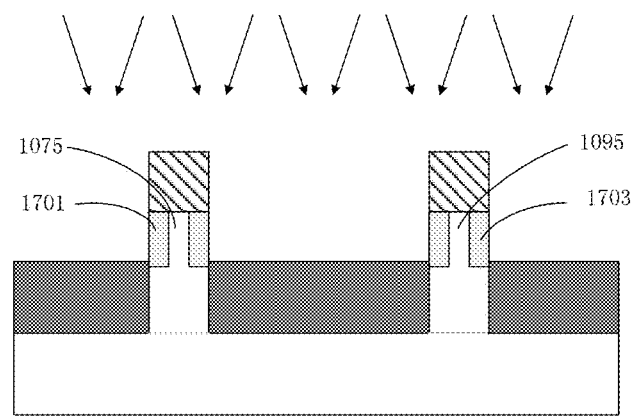

The second region 1075 is the part of the first semiconductor layer that is not the first region 1701, as shown in FIG. 17. The second region 1075 is between the source region portion 1003 and the drain region portion 1005 in FIG. 10B. The second region 1075 may have a first conductivity type, such as n-type or p-type. The first region 1701 has a second conductivity type that is opposite to that of the second region 1075.

The third region 1071 is formed in the exposed outer surface under the hardmask 111 of the first region 1701, that is, in a surface of the first region 1701 that is not covered by the insulating material layer 103 or the hard mask 111. The third region 1071 can have the first conductivity type that is the same as that of the second region 1075 but opposite to that of the channel region (which will be described later).

Depending on different methods for forming the third region 1071 in the exposed surface of the first region 1701, the lower end of the third region 1071 can extend lower than the upper surface of the insulating material layer 103. This is also embraced within the scope of the present disclosure.

Portions of the first region that is not the third region form the channel region 1073. As would be appreciated by those skilled in the art, a current path can be formed between the source region and the drain region through the channel region. Thus, preferably, the channel region 1073 is formed to adjoin the source region and the drain region (or the source region portion 1003 and the drain region portion 1005 in FIG. 10B which will be described later). Moreover, the channel region 1073 has a second conductivity type which is opposite to the first conductivity type. In addition, as would be understood by those skilled in the art, the channel region 1073 has a channel direction extending between the drain region and the source region. In one embodiment, the channel direction of the channel region 1073 can run along the longitudinal direction of the fin 107 (for example, the direction perpendicular with the plane of the page in FIG. 1A).

Besides, as would be better understood from the following description, the channel region 1073 separates the second region 1075 from the third region 1071. That is to say, the depth of the first region 1701 extending into the surface of the semiconductor layer 1070 is larger than the depth of the third region 1071 extending into the surface of the semiconductor layer.

Depending on different implementations, the cross-sectional shape of the second region 1075 varies. In some embodiments of the present invention, as shown in FIG. 17, the second region 1075 has a lower portion and an upper portion extending from the lower portion. In one embodiment, the second region 1075 can have a reverse T-shape. Here, the lower portion is substantially lower than the upper surface of the insulating material layer 103.

In such a case, in one embodiment, the first region 1701 can be formed on the lower portion of the second region and adjoin two sides of the upper portion along the channel direction of the channel region and the upper surface of the lower portion.

In addition, in one embodiment, the channel region 1073 can be formed on the lower portion of the second region 1075, and at least adjoins two sides of the upper portion along the channel direction of the channel region and the upper surface of the lower portion. In one embodiment, the channel region may have a "⌐" shape or a "⌐" shape in its sectional view.

In such a case, in one embodiment, the third region adjoins two sides of the channel region 1073 along the channel direction, as in FIG. 1A.

It should be understood that the second region 1075 and the third region 1071 respectively function as a first channel control region and a second channel control region for controlling the channel region. Hence, a bias (for example, a reverse bias, a zero bias, or even a positive bias) may be created through the second region 1075 and the third region 1071, thereby controlling the channel (channel region) to turn ON/OFF.

It should be understood that the structure of the fin 107 is merely an example of the present invention, and the present invention is not limited to the particular structure that is disclosed. For example, although a fin having a hard mask formed therein is shown herein, the present invention is not limited to having a hard mask. As will be described later in other embodiments, the hard mask can be removed.

In other embodiments (which will be described later), the channel region can comprise a portion (the first portion) adjoining the upper portion of the second region in addition to the portion that adjoins the two vertical sides of the upper portion along the channel direction of the channel region ("vertical" with respect to the figures). Moreover, the second channel control region further comprises a portion (the second portion) on the first portion of the channel region and adjoining the first portion of the channel region.

Figure 1B:
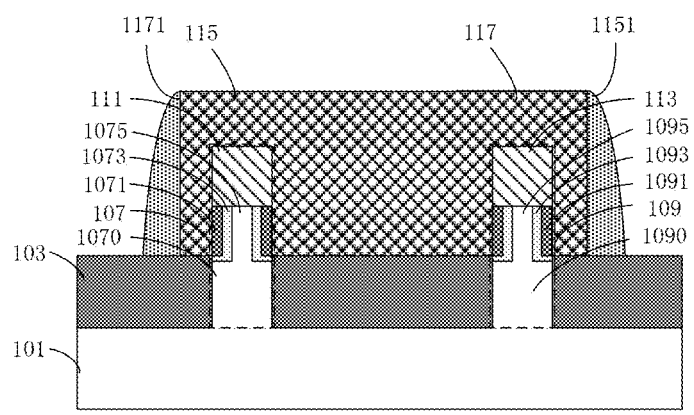
Figure 1C:
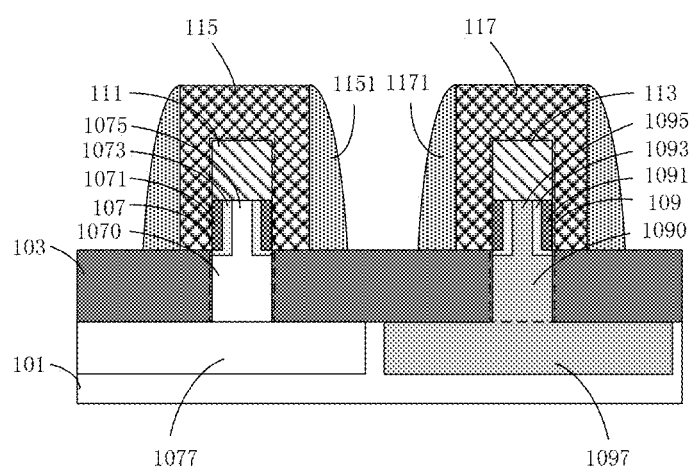

As described above, the semiconductor layer 1070 also can have a source region and a drain region that adjoins the channel region 1073. Since FIGS. 1A-1C are sectional views of the fin, the source region and the drain region are not shown in these figures. It should be understood that the source region and the drain region may have the same conductivity type as that of the channel region (that is, the second conductivity type).

The semiconductor device according to the present disclosure can have one or more fins. For example, in addition to fin 107, there also can be a fin 109 having a structure that is substantially identical to that of fin 107. The fin 109 has a semiconductor layer 1090 and a hard mask 113 over the semiconductor layer 1090.

The semiconductor layer 1090 has a source region portion and a drain region portion (not shown in FIG. 1A and similar to what is shown in FIG. 10B), as well as a first region 1703 (see FIG. 17), a second region 1095 (see FIG. 1A and FIG. 17) and a third region 1091 (see FIG. 1A and FIG. 22A) between the source region portion and the drain region portion.

Here, the structure of the fin 109 can be substantially identical to that of the fin 107.

In addition, the semiconductor device 100A further comprises a gate for a respective fin, as shown in FIG. 1C. The semiconductor device 100A can comprise a gate 115 for the fin 107. The gate 115 adjoins the second channel control region 1071 from the outer side of the second channel control region 1071 (or to say, the outer side opposite to the channel region 1073). Although the gate 115 also covers the hard mask above the channel control region in FIG. 1A, it should be understood that the gate 115 herein is still of a double gate structure. Besides, it also should be understood that the gate 115 is formed over the insulating material layer 103.

FIG. 1C illustrates that the semiconductor device further comprises a gate 117 for the fin 109. The gate 117 adjoins the channel control region 1091 from the outer side of the channel control region 1091 (the outer side opposite to the channel region 1073). The gate 117 is also formed over the insulating material layer 103.

In one embodiment, the gates 115 and 117 are formed of one of doped poly-silicon, doped amorphous silicon, and metal materials.

In one embodiment, the second channel control region 1071 and 1091 can have a relatively higher concentration, for example, be p$^+$ or n$^+$, for facilitating the formation of an ohmic contact and thus reducing contact resistance.

Herein, fin 107 can be referred to as a first fin and the fin 109 can be referred to as a second fin.

Moreover, it should be understood that, in the case where the fins 107 and 109 are initially formed, the fin 107 (the first fin) can have a conductivity type opposite to that of the fin 109 (the second fin). In other words, it is possible to make the channel region (channel) 1073 in the fin 107 have a conductivity type opposite to that of the channel region 1093 in the fin 109, and thus it is possible to form an n-type (i.e. n-channel) junction field effect device (nJFET) and a p-type (i.e. p-channel) junction field effect device (pJFET) in the semiconductor apparatus according to the present disclosure, as shown in FIG. 1C.

As shown in FIG. 1C, fin 107 and fin 109 have different conductivity types at an initial stage (one is shaded and the other is not). For example, the semiconductor layer 1070 may be of n-type while the semiconductor layer 1090 may be of p-type. As such, the corresponding channel regions 1071 and 1091 may have a p-type conductivity and an n-type conductivity respectively. In one embodiment, a region 1077 and a region 1097 are formed in the substrate to provide power for the first channel control regions 1075 and 1095 respectively. It should be understood that the regions 1077 and 1097 are not limited to being formed below the fin. For example, in some implementations, regions 1077 and 1097 can partially extend into the fin so as to be adjacent to the first channel control region. In other implementations, power can be provided for one or both of the first channel control regions 1075 and 1095 through the entire substrate or a partial region of the substrate.

In the embodiment of FIG. 1B, gates 115 and 117 are formed integrally as one piece, but this is not a limitation. Gates 115 and 117 can be formed as two individual gates separated from one another, as shown in FIGS. 1C, 2A and 2B. The present invention can be applied to various structural configurations.

Note that, in FIG. 1B, sidewalls 1151 and 1171 respectively formed on corresponding walls of the gates 115 and 117 are shown. As would be understood by those skilled in the art, since FIG. 1B is a sectional view of the fin, the sidewalls 1151 and 1171 shown herein are not spacers (as indicated by 1153 in FIG. 10B) provided between the source/drain and the gate, but are sidewalls formed on other walls of the gate while the spacer is formed.

The lateral dimension (width) of the fin maybe relatively small (e.g. several angstroms (Å)) and may be much smaller than the minimum dimension or critical dimension (CD) allowed by corresponding via fabrication process in some embodiments. In such a case, gate 115 and gate 117 may need to be extended so as to facilitate via connection. However, the present invention is not limited to this.

FIG. 2A shows a semiconductor device 200A according to another embodiment of the present disclosure, in which fin 207 and fin 209 are shown. Device 200A differs from the semiconductor device 100A of the embodiment illustrated in FIG. 1A in that the hard mask in the fin is absent, and a second region 801 and 803 of a reverse U shape (see FIG. 8) and a third region 2071 of a reverse U shape are formed. That is to say, the channel region further comprises a first portion (801-1, 803-1, see FIG. 8) over the upper portion of the second region and adjoining the upper portion, and the second channel control region further comprises a second portion (2071-1, 2091-1, see FIG. 13A) over the first portion of the channel region and adjoining the first portion of the channel region.

The semiconductor device 200A comprises the substrate 101 on which one or more fins (e.g. fin 207 and fin 209, as indicated in the dotted block of FIG. 2) are formed. Herein, as described before, the substrate 101 can be a bulk substrate.

An insulating material layer (first insulating material layer) 203 surrounding the fins 207 and 209 is also formed over the substrate 101, so as to support the fins. Herein, the thickness of the insulating material layer 203 is less than the thickness of the fin(s).

Fin 207 is formed of semiconductor material, and thus the fin itself can be a semiconductor layer. The fin 207 has a source region portion and a drain region portion (not shown in FIG. 2A, but can be more clearly seen from FIG. 10B) as well as a first region 801, a second region 2075 and a third region 2071 between the source region portion and the drain region portion.

Figure 8:
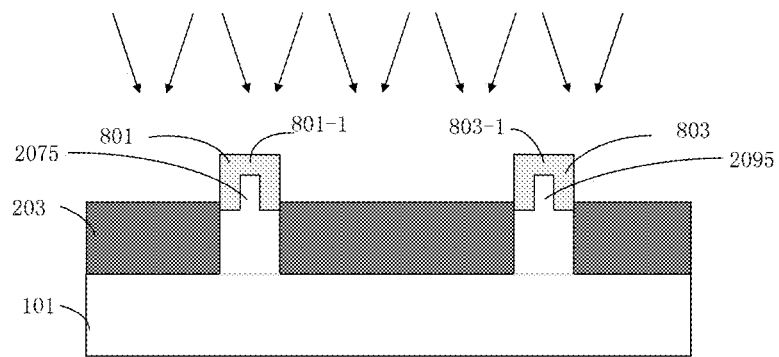

The first region 801 is formed in the exposed surface of the semiconductor layer 207 in the portion of the fin 207 that is not covered by the insulating material layer 203, as illustrated by FIG. 8. Herein, a first region 801 of a reverse U shape is formed.

Depending on the method used for forming the first region 801 in the semiconductor layer 207, the lower end of the first region 801 can extend in the semiconductor layer 207 below the upper surface of the insulating material layer 203. This is also embraced within the scope of the present disclosure. Thus, in the present invention, the first region can be at least formed in the exposed surface of the first semiconductor layer in the portion of the fin which portion is not covered by the first insulating material layer.

The second region 2075 is the part of the semiconductor layer (i.e. fin) 207 that is not the first region 801, as shown in FIG. 8. The second region 2075 is between the source region portion and the drain region portion. The second region 2075 can have a first conductivity type, for example, n-type or p-type. The first region 801 has a second conductivity type which is opposite to that of the second region 2075.

The third region 2071 is formed in the exposed surface of the first region 801, i.e. the surface of the first region 801 that is not covered by the insulating material layer 203. The third region 2071 can have a first conductivity type, i.e. a conductivity type which is the same as that of the second region 2075 but opposite to the conductivity type of the channel region which will be described later.

The portion of the first region 801 that is not the third region 2071 forms the channel region 2073. The channel region 2073 adjoins the source region portion and the drain region portion. The channel region 2073 has the second conductivity type opposite to the first conductivity type. In addition, as would be understood by those skilled in the art, the channel region 2073 has a channel direction extending between the source region portion and the drain region portion. In one embodiment, the channel direction of the channel region 2073 can run along the longitudinal direction of fin 107 (for example, a direction perpendicular to the plane of the page in FIG. 1).

In addition, as would be better understood from the following description, the channel region 2073 separates the second region 2075 from the third region 2071. That is to say, the depth of the first region with respect to a surface of the semiconductor layer is larger than the depth of the third region with respect to the surface of the semiconductor layer.

In some embodiments of the present invention, the second region 2075 has a lower portion and an upper portion extending from the lower portion, as more clearly shown in FIG. 8. In one embodiment, the second region 2075 can have a reverse T-like shape. Herein, the lower portion is positioned below the upper surface of the insulating material layer 103.

In such a case, the first region 801 can be formed above the lower portion of the second region and adjoin the two sides of the upper portion along the channel direction of the channel region and the upper surface of the lower portion. Herein, the first region 801 also comprises a portion 801-1 (see FIG. 8) over the upper portion of the second region 2075 and adjoining the upper portion.

In addition, in such a case, the channel region 2073 is formed above the lower portion of the second region 2075 and at least adjoins the two sides of the upper portion along the channel direction of the channel region and the upper surface of the lower portion. Moreover, the channel region 2073 further comprises a portion (a first portion) 2073-1 over the upper portion of the second region and adjoining the upper portion. That is to say, the channel region has a "Ω"-like shape, a "⊓"-like shape, or the like.

In one embodiment, the third region 2071 adjoins the two sides of the channel region 2073 along the channel direction of the channel region 2073. The third region 2071 (the second channel control region) further comprises a portion (a second portion) 2071-1 over the first portion 2073-1 of the channel region 2073 and adjoining the first portion of the channel region (see FIG. 13A).

It should be understood that the second region 2075 and the third region 2071 can respectively function as a first channel control region and a second channel control region for controlling the channel region. That is to say, bias (for example, a reverse bias, a zero bias, or even a positive bias) can be provided through the second region 2075 and the third region 2071, thereby controlling the channel (channel region) to be turned ON/OFF.

As described above, the semiconductor layer 207 can also have a source region portion and a drain region portion formed therein that adjoin the channel region 2073. Since FIG. 2A is a sectional view of the fin, the source region portion and the drain region portion are not shown in this figure. It should be understood that the source region portion and the drain region portion will have a conductivity type as same as that of the channel region, i.e. the second conductivity type.

The structure of fin 209 is substantially identical to that of fin 207, but the conductivity types of the corresponding regions of these two fins can be the same or different.

In FIG. 2B, gate 115 and gate 117 are illustrated as two individual gates that are separated from one another. Gates 115 and 117 respectively adjoin the second channel control regions 2071 and 2091 from the outer sides of the second channel control regions 2071 and 2091. Gates 115 and 117 are formed over the insulating material layer 203. Moreover, in FIG. 2B, sidewalls 1151 and 1171 that respectively correspond to gates 115 and 117 are illustrated. As described above, the sidewalls 1151 and 1171 shown herein are not the spacers (which are indicated by reference numeral 1153 of FIG. 10B) provided between the source/drain and the gate, but are formed on other walls of the gate while the spacer is formed.

Figure 2C:
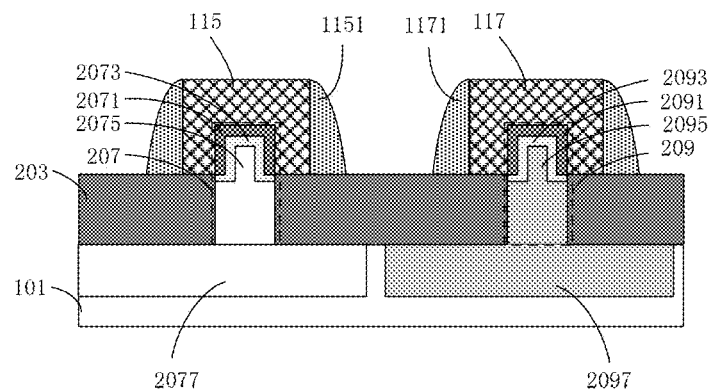

As shown in FIG. 2C, fin 107 and fin 109 have different conductivity types at an initial stage (one is shaded and the other is not). For example, the semiconductor layer 207 has an n-type while the semiconductor layer 209 has a p-type. As such, the corresponding channel regions 2073 and 2093 respectively have a p-type conductivity type and an n-type conductivity type. In one embodiment, a region 2077 and a region 2097 can be provided in the substrate to provide power for the first channel control regions 2075 and 2095, respectively. In one embodiment, the regions 2077 and 2097 adjoin the first channel control regions 2075 and 2095, respectively. It should be understood that the regions 2077 and 2097 are not limited to being provided below the fins. For example, in some implementations, parts of the regions 2077 and 2097 can be extended into the fin so as to adjoin the channel control region. In other implementations, power can be provided for one or both of the first channel control regions 2075 and 2095 through the entire substrate or a partial region of the substrate.

Other features of the embodiments illustrated in FIGS. 2A, 2B and 2C can be substantially consistent with those of FIGS. 1A, 1B and 1C, and thus detailed descriptions thereof are omitted.

As will be described below, the semiconductor device (100A, 200A) according to the present disclosure can also comprise a spacer located at the two sides of the gate that are adjacent the source region (source region portion) and the drain region (drain region portion).

In addition, although it is not shown in the figures, the semiconductor device can further comprise semiconductor material portions epitaxially grown on the source region portion 1003 and the drain region portion 1005. In such a case, the source region portion 1003 and the drain region portion 1005 together with the semiconductor material portions epitaxially grown therefrom constitute the source region and the drain region, respectively. On the other hand, in the case where such epitaxial growth is not carried out, the source region portion 1003 and the drain region portion 1005 are source and drain regions of the device.

Now, steps for forming a substrate having a fin formed thereon according to the present disclosure will be described with reference to FIGS. 3A-3D, 4, 5A and 5B.

Figure 3A:
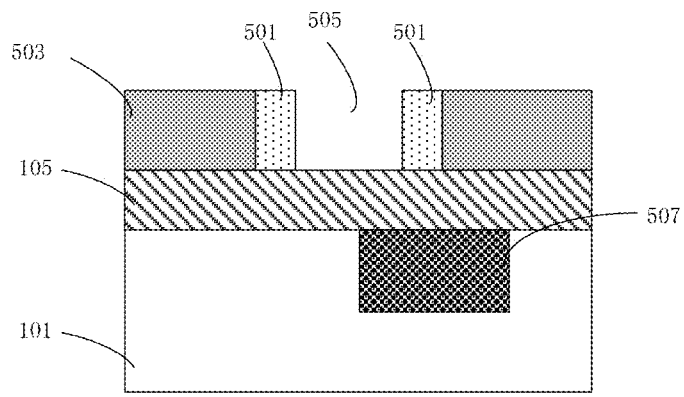
FIGS. 3A-3D and FIG. 4 are schematic cross-sectional diagrams showing methods of manufacturing a fin according to some embodiments of the present disclosure.
Figure 3B:
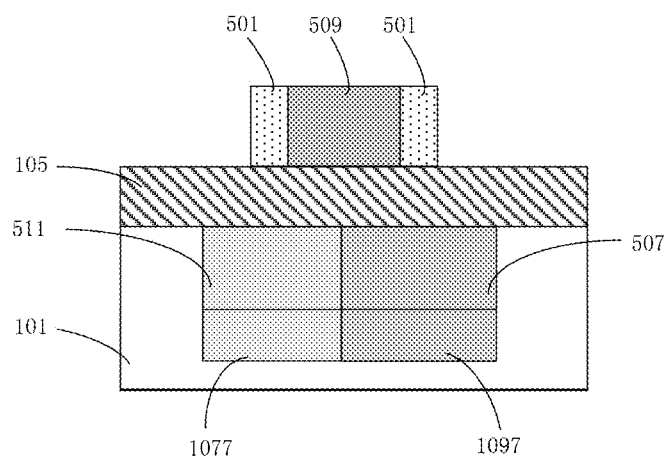
Figure 3C:
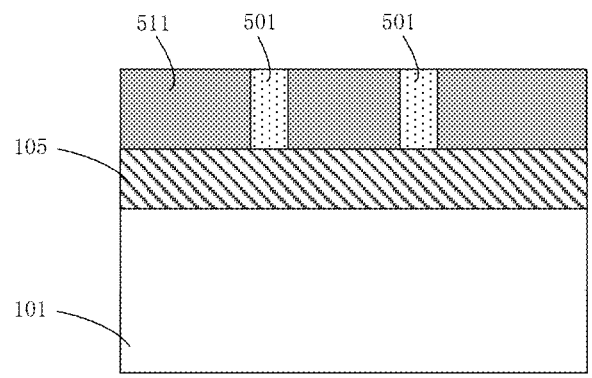

FIGS. 3A-3C are diagrams showing several methods for forming a mask used for etching according to embodiments of the present disclosure.

FIG. 3A shows a situation where the mask is formed by a mandrel-spacer method according to one embodiment of the present disclosure. As shown in FIG. 3A, the wafer has a semiconductor layer 101. A hard mask layer 105 is formed over the wafer to cover the semiconductor layer 101.

Thereafter, a mandrel layer 503 can be formed over the hard mask 105. The mandrel layer 503 can be formed from silicon oxide, poly-silicon, or the like, for example. An opening 505 can be formed at a desired position in the mandrel layer 503, as exemplarily shown in FIG. 3A. Then, spacers 501 located on the two sidewalls of the opening can be formed. Thereafter, the mandrel layer 503 is removed while the spacer 501 is maintained to serve as a mask required for forming fins by etching.

A region 507 having a different conductivity type can be formed at a desired position (for example, below the right-side spacer) of layer 101. The region 507 can be used for forming a fin of different conductivity type.

FIG. 3B shows another method for forming the mask. A sacrificial pattern 509 is formed over the hard mask 105. Then, spacers 501 are formed on the walls of the sacrificial pattern 509. Next, the sacrificial pattern 509 is removed while the spacers 501 remain to serve as a mask required for forming fins by etching.

Similarly, regions 507 and 511 having different conductivity types can be formed at desirable positions (e.g. below the left-side spacer and the right-side spacer) of layer 103. The regions can be used for forming fins of different conductivity types. Moreover, the aforementioned regions 1077/ 1097 and 2077/2097 can be formed below the regions 507 and 511 in the semiconductor layer 101. The region 507 can have a conductivity type same as that of the region 1097 and can have a same impurity concentration. The region 511 can have a conductivity type same as the region 1077 and can have the same impurity concentration.

FIG. 3C shows another method for forming the mask, in which a double-patterning method known in the art is employed. For example, a patterned mask 501 can be formed in a resist 511 through double-lithography. Thereafter, the unnecessary part of the resist 511 can be removed. In such a case, pattern 501 can be baked before performing an etching with the mask, such that pattern 501 will not easily collapse during the etching process.

Figure 3D:
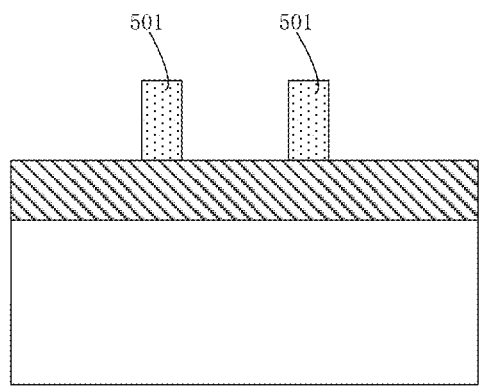
Figure 4:
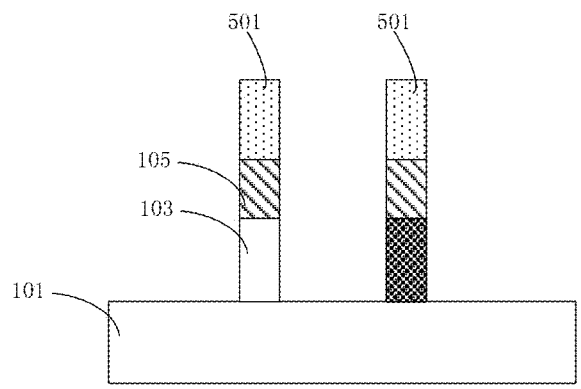

As shown in FIG. 3D, a patterned mask 501 used for etching is formed. Thereafter, the hard mask layer 105 and the semiconductor layer 101 are etched with use of this mask, thereby forming the fin(s), as shown in FIG. 4. As would be understood by those skilled in the art, the etching can be performed through multiple stages of etching. For example, the hard mask layer 105 and the semiconductor layer (the first semiconductor layer) 101 may be etched sequentially. Or, the etching can be performed in one process step in one and the same etching apparatus, and the wafer is not removed from the etching apparatus. Thereafter, the mask 501 is removed and the hard mask layer is selectively removed, thereby forming the fin (e.g. 107, 109; 207, 209), as shown in FIGS. 5A and 5B.

Figure 5A:
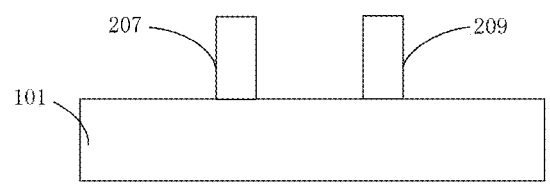
FIGS. 5A and 5B are schematic cross-sectional diagrams showing a semiconductor substrate having a fin according to the embodiments of the present disclosure.
Figure 5B:
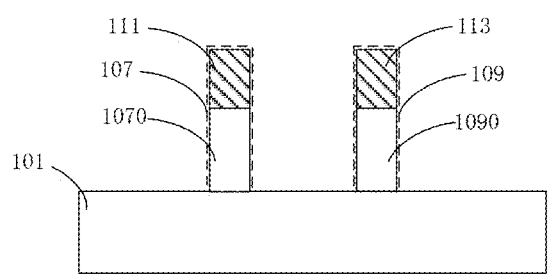

According to the present disclosure, as shown in FIGS. 5A and 5B, a substrate with one or more fins (107, 109, 207, 209) formed on the surface thereof is provided, wherein the fins may have a semiconductor layer (1070, 1090, 207, 209) formed of a semiconductor material having a first conductivity type. In some embodiments of the present disclosure, the fin can further comprise a hard mask 111/113 on the semiconductor layer 1070/1090. Herein, the first conductivity type can be an n-type or a p-type.

Below, subsequent fabrication process will be described for a fin structure with a hard mask and a fin structure without a hard mask, respectively.

First, steps of the manufacturing method of a device according to one embodiment of the present disclosure will be described with reference to FIGS. 5A, 6, 7, 8, 9A, 9B, 10A, 10B, 11A, 11B, 12A, 12B, 13A, 13B, 14, 15A, and 15B.

A substrate 101 as shown in FIG. 5A is provided, on a surface of which one or more fins, for example, 207 and 209, are formed. Herein, the fins 207 and 209 themselves are semiconductor layers formed of a semiconductor material and having a first conductivity type. In addition, although two fins are shown herein, it should be understood that the semiconductor device of the present invention can comprise one or more fins, as described above. Moreover, the component structures of the device of the present invention are not limited to the situations shown in the figures of the present invention.

Next, an insulating material layer 203 (the first insulating material layer) surrounding the fins 207 and 209 is formed over the substrate 101. The insulating material layer 203 has a predetermined thickness (T) that is less than the thickness (Hsemi) of the semiconductor layer. Thus, the dummy gate and gate to be formed later will be formed above the insulating material layer.

Figure 6:
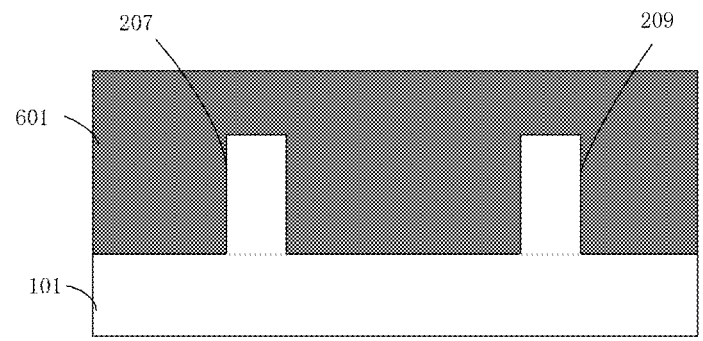
FIGS. 6, 7, 8, 9A and 9B, 10A and 10B, 11A and 11B, 12A and 12B, 13A and 13B, 14, 15A and 15B are schematic cross-sectional diagrams showing the steps of a method of manufacturing a semiconductor device according to one embodiment of the present invention.

In one implementation of the present disclosure, as shown in FIG. 6, an insulating material 601 is formed on the substrate 101 to cover the fins 207 and 209. Fins 207 and 209 can have the first conductivity type, such as n-type or p-type. Although it is not shown in the figures, it should be understood that, for example, the aforementioned regions 2077 and 2097 can be formed in the substrate 101 in advance.

Figure 7:
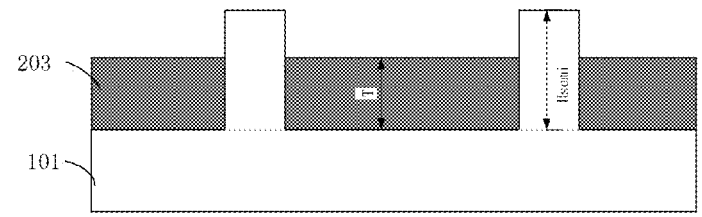

Next, as shown in FIG. 7, the insulating material 601 is partially removed to a predetermined thickness that is less than the height of the fin (the semiconductor layer). Thus, the insulating material layer 203 (the second insulating material layer) is formed. Note that, in this example, fins 207 and 209 are semiconductor layers; however, in the situation where the fin further has a hard mask layer, the height/thickness mentioned herein refers to the height/thickness of the semiconductor layer (for example, 1070 and 1090, or the like) in the fin without including the hard mask layer.

Here, the insulating material 601 can be reduced to the predetermined thickness through processes such as etching-back. As such, a portion of the semiconductor layer including the upper end thereof in the fin can be exposed. That is, the portion of the fin that is not covered by the insulating material layer 203 is formed.

In one embodiment, a ratio of the thickness T of the insulating material layer 203 to the difference between the height Hsemi of the semiconductor layer 207 and the thickness T of the insulating material layer 203 (i.e. the height of the portion of the semiconductor layer that is not covered by the insulating material layer 203, in the fin) is about 3-5, i.e. T/(Hsemi− T)=3-5 (see FIG. 7). However, it should be understood that, this ratio is not a limitation of the present invention.

Thereafter, as shown by arrows in FIG. 8, a dopant that can impart a second conductivity type opposite to the first conductivity type is introduced into the fin (i.e. the exposed surface of the semiconductor layer), for example, by ion implantation, plasma treatment, or diffusion. Herein, in one embodiment, the ion implantation can be a tilt ion implantation. Thus, first regions 801 and 803 having the second conductivity type are formed respectively in the exposed surfaces of the semiconductor layers. Portions in the fin (i.e. the semiconductor layer) other than the first region 801, 803 form the second regions 2075 and 2095, respectively. Here, the second regions 2075 and 2095 have the first conductivity type. As would be described below, the second region can function as a first channel control region for controlling the channel region.

In the case where fins 207 and 209 have different conductivity types, that is to say, in the case where the channel regions to be formed in fins 207 and 209 have different conductivity types, the step of introducing the dopant can include, for example, the following stages: forming a first mask (e.g. a resist) to cover one of fins 207 and 209 (e.g., the first fin) while introducing a dopant having a corresponding conductivity type into another exposed fin (e.g., the second fin) ; then, removing the first mask, and forming a second mask to cover the another fin (e.g. the second fin) while exposing the one fin (e.g. the first fin); and, introducing a dopant having a corresponding conductivity type into the exposed one fin (e.g. the first fin).

In some embodiments of the present invention, the second regions 2075 and 2095 are formed such that they each have a lower portion and an upper portion extending from the lower portion, wherein the lower portion is substantially below the upper surface of the insulating material layer 203. In one embodiment, the second region can have a reverse T-shape. The first region 801/803 is formed above the lower portion of said second region, and further comprises a portion 801-1/803-1 over said upper portion and adjoining the upper portion in addition to the portions adjoining two sides of the upper portion and the upper surface of the lower portion (see FIG. 8). As would be understood from the following description, the two sides of the upper portion are two sides of the upper portion along the channel direction of the channel region.

Depending on the method for forming the first region 801/803 in the exposed surface of the semiconductor layer 207/209, the lower end of the first region 801/803 can extend into the semiconductor layer 207/209 and beyond the upper surface of the insulating material layer 203. This is also within the scope of the present invention.

Figure 9A:
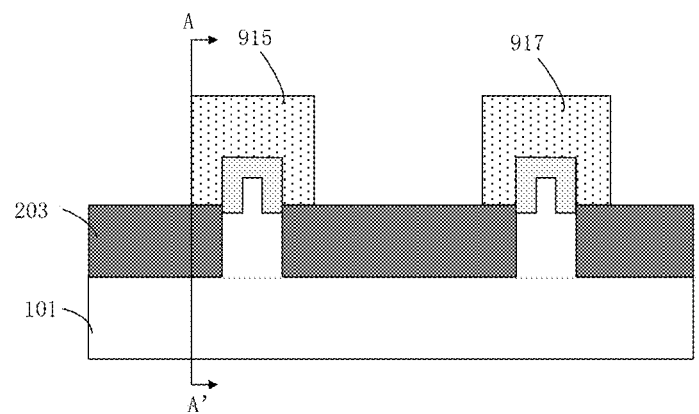
Figure 9B:
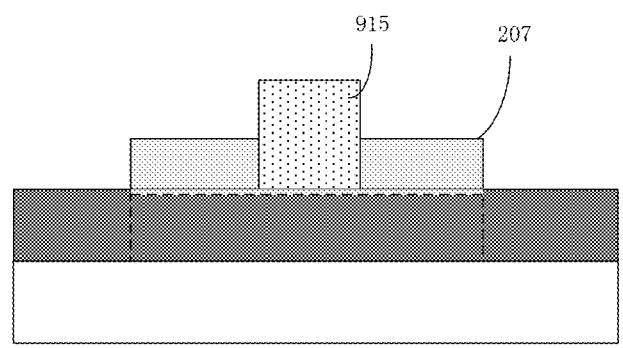

Thereafter, as shown in FIGS. 9A and 9B, dummy gates 915 and 917 used for fins are formed over the insulating material layer 203, so as to enclose the portions of the fins where the channel regions are to be formed. Here, FIG. 9B is a sectional view taken along line A-A' of FIG. 9A and viewed from a direction indicated by the arrow.

It should be understood that the dummy gate structure herein is merely illustrative, and those skilled in the art can freely design the configuration of the dummy gate as needed based on the teachings of the present invention. For example, the dummy gates 915 and 917 can be integrally formed as a continuous part. The dummy gates 915 and 917 are formed above the insulating material layer 203.

Moreover, it should be understood that, in this specification, only those main components or steps that are related to the present invention are described, while other components or steps that are not directly related to the present invention are not described in detail. For example, before forming the dummy gate, native oxide on the fin can be removed, for example by a wet process using a cleaning solution or a diluted hydrofluoric acid.

In some implementations of the present invention, forming the dummy gates 915 and 917 can comprise: forming a dummy gate material (e.g. poly-silicon) layer over the substrate having fins 207 and 209 formed thereon, to at least cover the fins; then, patterning the dummy gate material to form dummy gates 915 and 917.

As described above, only a part of the fin 207 (209) is covered by the dummy gate 915 (917), as shown in FIG. 9B, in which part a channel region will be correspondingly formed later.

Next, in one embodiment, as shown in FIGS. 10A and 10B, spacer(s) 1153 for the dummy gate is formed. Here, FIG. 10B is a sectional view taken along line A-A' of FIG. 10A and viewed from a direction indicated by the arrow. The spacer 1153 is formed on two sides of the dummy gate that are adjacent to the source region and the drain region to be formed later (or, the source region portion and the drain region portion). While, on other side surfaces of the dummy gate, sidewalls 1151 and 1171 can be formed correspondingly. Thus, these two are termed as spacer and sidewall, respectively, to be distinguished from one another. Here, the spacer 1153 can also formed above the insulating material layer 203.

Here, spacer/sidewall can be formed from silicon oxide, silicon nitride, silicon oxynitride, silicon nitrogen oxide, or the like, for example. However, the present invention is not limited to this.

In one embodiment, implantation can be preformed herein so as to form a source region portion 1003 and a drain region portion 1005 in the semiconductor layer, as shown in FIG. 10B. However, it should be understood that, the present invention is not limited to this.

The source region portion 1003 and the drain region portion 1005 can have the same conductivity type as that of the channel region. As for the depths of the source region portion and the drain region portion, there is no specific limitation, so long as the source region portion and the drain region portion adjoin the channel region to be formed later. In one embodiment, the depths of the source region portion 1003 and the drain region portion 1005 in FIG. 10B are substantially equal to the height of the semiconductor layer in the fin.

In one embodiment, after the formation of the spacer, a semiconductor layer having a certain thickness can be epitaxially grown on the exposed surface of the semiconductor layer. For example, in some embodiments, it is possible to epitaxially grow a semiconductor layer with a thickness of several tens of angstroms (Å). Actually, the thickness of the epitaxially grown semiconductor layer can be set based on, for example, the width of the fin.

After the epitaxial growth, implantation can be performed to form a source region and a drain region, including the source region portion 1003 and the drain region portion 1005 formed in the semiconductor layer. According to other implementations, implantation can be performed before the epitaxial growth, and in-situ doping can be performed during the process of epitaxial growth. Thus, in such a case, the source region portion and the drain region portion together with the semiconductor material portions epitaxially grown therefrom constitute the source region and the drain region. In the case where the epitaxial growth is not carried out, the source region portion and the drain region portion themselves are source region and drain region for the device.

In addition, it should be understood that the first channel control region in the second region adjoins the source region and the drain region (source region portion and drain region portion), and is located between the source region and the drain region (source region portion and drain region portion).

Incidentally, although a gate-last approach is employed in the illustrated embodiments, it should be understood that these embodiments are merely preferable and the present disclosure is not limited to these embodiments. That is to say, according to some embodiments of the present invention, spacer and source/drain are not formed immediately after the formation of the dummy gate. For example, a spacer can be formed after the formation of the gate, and then source region and drain region are formed, as would be better understood from the following descriptions.

Figure 11A:
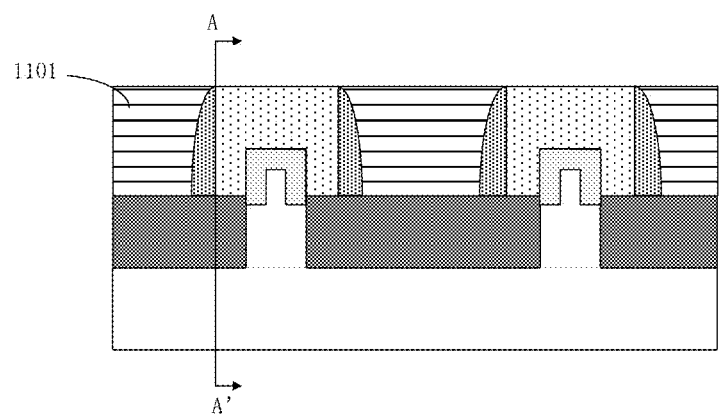
Figure 11B:
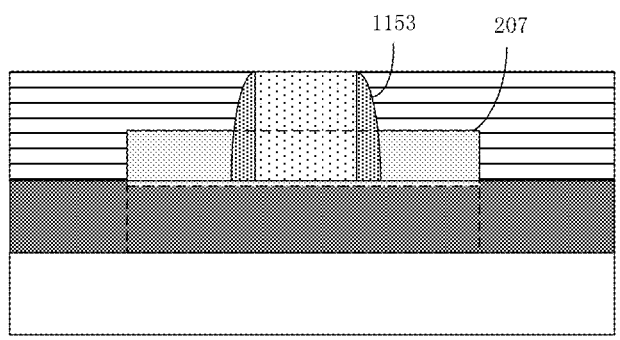

Thereafter, as shown in FIGS. 11A and 11B, an insulating material layer 1101 (the second insulating material layer) is formed to at least cover the exposed portion of the fins and expose the top of the dummy gate, and in one embodiment, also cover the spacer (if present). Herein, FIG. 11B is a sectional view taken along line A-A' of FIG. 11A and viewed from a direction indicated by the arrow.

In some preferred implementations, a second insulating material can be deposited on the substrate on which the dummy gate (and spacer, if present) has already been formed, so as to cover the exposed surface of the fin and the dummy gate (and the spacer, if present); thereafter, a part of the second insulating material can be removed to expose the upper surface of the dummy gate. For example, the process of removing can be performed by chemical mechanical polishing or etching-back, such that the upper surface of the layer formed from the second insulating material is substantially flush with the upper surface of the dummy gate. Thus, the second insulating material layer 1101 is formed. The second insulating material can be, but is not limited to, silicon oxide.

In the case where the above-mentioned spacer 1153 has been formed, the second insulating material layer 1101 preferably also covers the spacer 1153.

In addition, since fins 207 and 209 are shielded from view in some figures (e.g., FIG. 11B), their positions are identified by the broken lines.

Figure 12A:
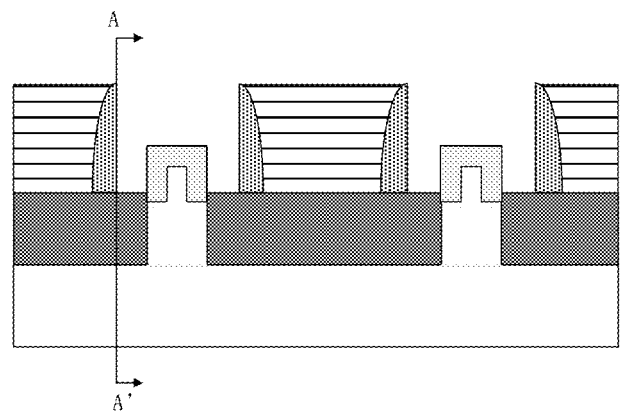
Figure 12B:
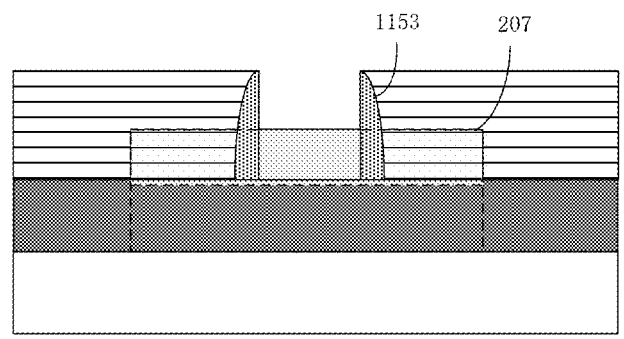

Next, as shown in FIGS. 12A and 12B, the dummy gate is removed to expose the semiconductor layer of the fin that was enclosed by the dummy gate. That is, the portion of the first region 801 that is enclosed by the dummy gate is exposed. Herein, FIG. 12B is a sectional view taken along line A-A' of FIG. 12A and viewed along a direction indicated by the arrow. The dummy gate can be removed by a wet etch method or a dry etch method, for example.

Figure 13A:
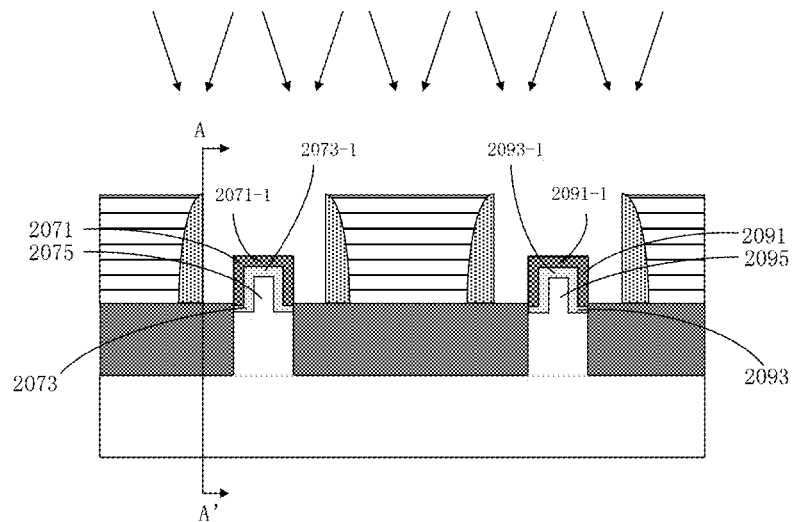
Figure 13B:
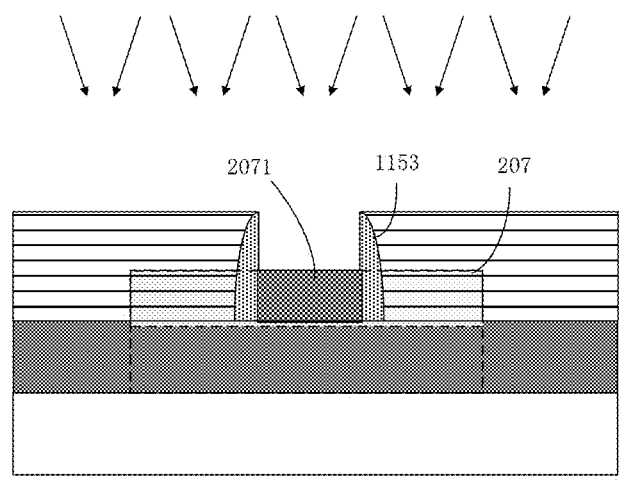

Then, as shown in FIGS. 13A and 13B, a second dopant that can impart the first conductivity type is introduced into the exposed portion of the first region in the semiconductor layer, such that third regions 2071 and 2091 having the first conductivity type are respectively formed in the exposed surfaces of the first regions 801 and 803. For example, the doping can be performed by ion implantation, plasma treatment, diffusion, or the like. Herein, FIG. 13B is a sectional view along line A-A' of FIG. 13A and viewed along a direction indicated by the arrow. The third regions 2071 and 2091 can also have a reverse U shape. The third region serves as a second channel control region for controlling the channel region.

Depending on the method used for forming the third region 2071/2091 in the exposed surface of the first region 801/803, the lower end of the third region 2071/2091 can extend in the first region 801/803 below the upper surface of the insulating material layer 203. This is also within the scope of the present invention.

Herein, the portion of the first region 801/803 that is not the third region 2071/2091 functions as the channel region 2073/2093, which has the second conductivity type. As would be appreciated by those skilled in the art, a current path can be formed between the source region and the drain region through the channel region. The channel region 2073/2093 has a channel direction extending between the source region portion and the drain region portion. Herein, the channel region 2073/2093 is formed above the lower portion of the second region 2075/2095 and at least adjoins the two sides of the upper portion along the channel direction of the channel region and the upper surface of the lower portion, and further comprises a portion (the first portion) 2073-1/2093-1 formed over the upper portion of the second region and adjoining the upper portion. That is to say, the channel region 2073/2093 can have a top hat shape, a Ω shape or a "⊓" shape. In one embodiment, the channel direction runs along the longitudinal direction of the fin (defined above).

Herein, as described above, the channel region 2073 separates the second region 2075 from the third region 2071. That is to say, the thickness of the first region into the surface of the semiconductor layer is larger than the thickness of the third region into the surface of the semiconductor layer.

Herein, the third region at least adjoins the two sides of the channel region along the channel direction of the channel region, and further comprises a portion (a second portion) 2071-1/2091-1 over the portion 2073-1/2093-1 (the first portion) of the channel region and adjoining the portion 2073-1/2093-1 (the first portion) of the channel region.

In one embodiment, ion implantation is used for introducing the dopant, and in another embodiment, a tilt ion implantation is used for introducing the dopant. For example, the incident angle of the ion can be adjusted to be not perpendicular to the substrate surface.

In addition, in one embodiment, after the process such as ion implantation, an annealing (e.g. rapid annealing treatment) can be performed, so as to repair the damages caused by ion implantation.

Likewise, in the case where fins 207 and 209 have different conductivity types, that is, where the channel regions to be formed in fins 207 and 209 have different conductivity types, their respective introductions of dopants can be performed separately. For example, the first fin can be covered with a mask (e.g. a resist) while dopant is introduced into the second fin; and vice versa.

Figure 14:
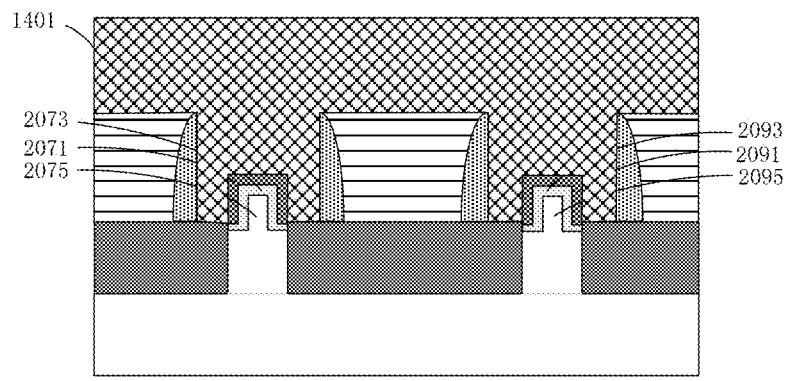
Figure 15A:
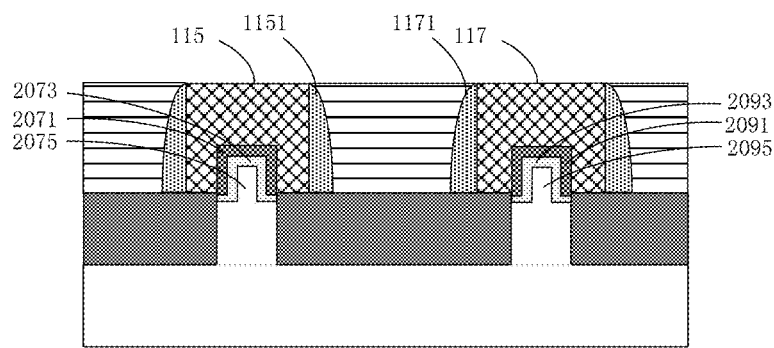
Figure 15B:
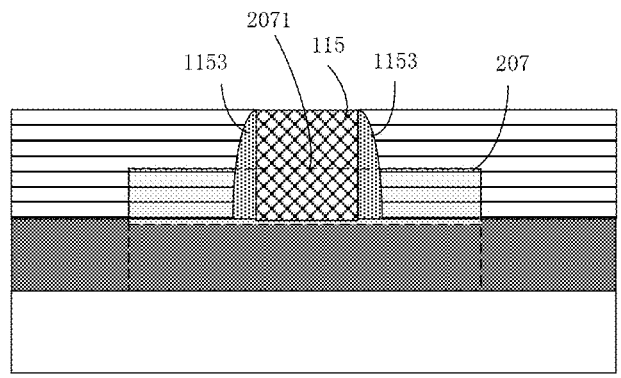

Thereafter, as shown in FIGS. 14, 15A and 15B, gates 115 and 117 for the fins are formed, wherein the gates adjoin the second channel control region from the outer sides of the second channel control regions. The gates 115 and 117 are also formed on the insulating material layer 203.

For example, in one implementation, a gate material layer 1041 can be formed over the substrate, as shown in FIG. 14. According to different embodiments, the gate material can be doped poly-silicon, doped α-silicon (amorphous silicon), metal material, or the like. Then, for example, chemical mechanical polishing is performed until the upper surface of the first insulating material layer 1001 is substantially exposed, or until the upper surface of the gate material layer is substantially flush with the upper surface of the first insulating material layer 1001. Thus, gates 115 and 117 are formed, as shown in FIGS. 15A and 15B. Here, FIG. 15B is a sectional view taken along line A-A' of FIG. 15A and viewed along the direction indicated by the arrow. FIG. 15B more clearly shows the spacer 1153 for the gate 115.

Below, steps of the manufacturing method of a device according to one embodiment of the present disclosure will be described with reference to FIGS. 5B, 16, 17, 18A, 18B, 19A, 19B, 20A, 20B, 21A, 21B, 22A and 22B. In this embodiment, the fin has a hard mask on the semiconductor layer.

Firstly, a substrate 101 as shown in FIG. 5B is provided, on a surface hereof one or more fins (e.g. fins 107 and 109) are formed, as indicated in the dotted block of FIG. 1. Herein, in one embodiment, the substrate can be a bulk substrate, such as bulk silicon substrate. It should be understood that the above-mentioned regions 1077 and 1097 can be formed in the substrate 101 in advance although not shown in the figure.

In addition, although two fins are shown herein, it should be understood that, as described above, the semiconductor device of the present invention can comprise one or more fins. In addition, the component structures of the device of the present disclosure are various, and not limited to the situations illustrated in the figures of the present disclosure.

Fin 107 has a semiconductor layer 1070 (a first semiconductor layer) formed of a semiconductor material and a hard mask 111 on the semiconductor layer 1070; while, fin 109 has a semiconductor layer 1090 formed of a semiconductor material and a hard mask 113 on the semiconductor layer 1090, as shown in the dotted block of FIG. 5B.

Figure 16:
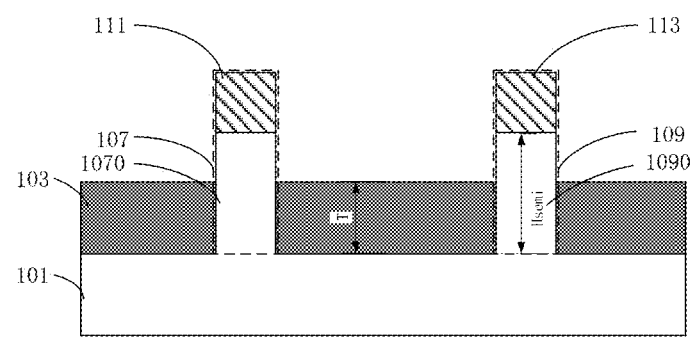
FIGS. 16, 17, 18A and 18B, 19A and 19B, 20A and 20B, 21A and 21B, 22A and 22B, 23A and 23B are schematic cross-sectional diagrams showing the steps of a method of manufacturing a semiconductor device according to another embodiment of the present disclosure.

Next, as shown in FIG. 16, an insulating material layer 103 (first insulating material layer) surrounding the fins 107 and 109 is formed over the substrate 101. The insulating material layer 103 has a predetermined thickness that is less than the thickness of the semiconductor layer 1070/1090. Thus, the dummy gate and the gate to be formed later will be formed above the insulating material layer.

In one embodiment, the thickness of the insulating material layer 103 is less than the thickness of the fin. More preferably, a ratio of the thickness T of the insulating material layer 103 to the difference between the height Hsemi of the semiconductor layer 1070/1090 and the thickness T of the insulating material layer 103 is about 3-5, i.e. T/(Hsemi−T)=3-5.

Thereafter, as shown in FIG. 17, a dopant that can impart a second conductivity type opposite to the first conductivity type is introduced into the fin (actually, i.e. the exposed surface of the semiconductor layer 1070,1090), for example, by ion implantation, plasma treatment, diffusion, or the like. Herein, in one embodiment, the ion implantation can be a tilt ion implantation. Thus, first regions 1701 and 1703 having the second conductivity type are formed respectively in the exposed surfaces of the first semiconductor layers 1070 and 1090. Portions in the semiconductor layers 1070 and 1090 other than the first regions 1701, 1703 are used as the second regions 1075 and 1095. Here, the second regions 1075 and 1095 have the first conductivity type. Similarly, the second region can be used for providing a first channel control region for controlling the channel region.

In some preferred embodiments of the present disclosure, the second regions 1075 and 1095 are formed such that they respectively have a lower portion and an upper portion extending from the lower portion and the lower portion is substantially lower than the upper surface of the insulating material layer 103. The first regions 1701 and 1703 are formed above the lower portion of the second region, and adjoin two sides of the upper portion and the upper surface of the lower portion. As would be understood from the following description, the two sides of the upper portion are two sides of the upper portion along the channel direction (as described above with reference to FIGS. 1A-1C) of the channel region.

Depending on different methods for forming the first region 1701 in the exposed surface of the semiconductor layer 1070, the lower end of the first region 1701 can extend in the semiconductor layer 1070 below the upper surface of the insulating material layer 103. This is also within the scope of the present disclosure.

Figure 18A:
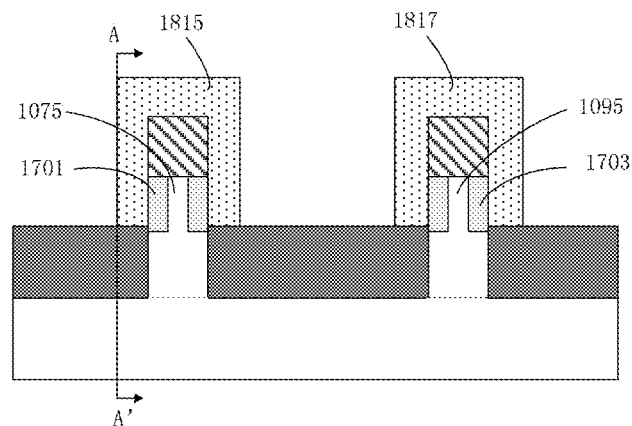
Figure 18B:
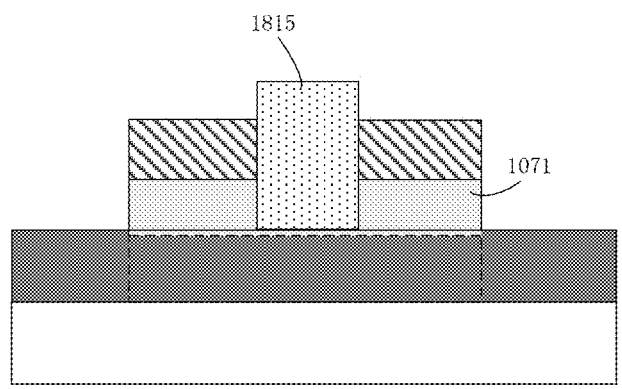

Thereafter, as shown in FIGS. 18A and 18B, dummy gates 1815 and 1817 for the fins are formed over the insulating material layer 103, so as to enclose the portions of the fin where the channel regions to be formed. Here, FIG. 18B is a sectional view taken along line A-A' of FIG. 18A and viewed along a direction indicated by the arrow.

In one embodiment, before forming the dummy gate, native oxide on the fin can be removed.

As described above, as shown in FIG. 18B, only a part of fin 107 (109) is covered by the dummy gate 1815 (1817), in which part a channel region will be correspondingly formed later.

Figure 19A:
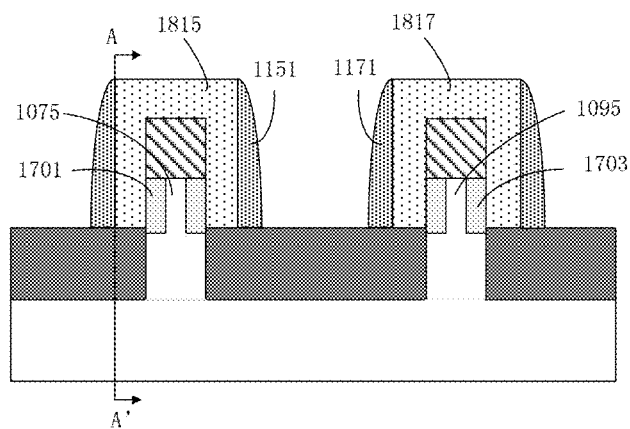
Figure 19B:
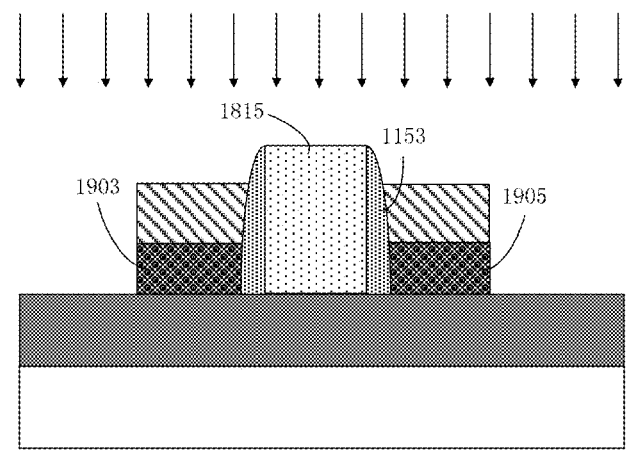

Next, in one embodiment, as shown in FIGS. 19A and 19B, a spacer 1153 for the dummy gate is formed. Here, FIG. 19B is a sectional view taken along line A-A' of FIG. 19A and viewed from a direction indicated by the arrow. The spacers 1153 are formed on two sides of the dummy gate that adjoin a source region portion 1903 and a drain region portion 1903 to be formed later. While, on other side surfaces of the dummy gate, sidewalls 1151 and 1171 can be formed correspondingly. Thus, these two are termed as spacer and sidewall, respectively, so as to be distinguished from one another. Here, the spacer 1153 can also be formed above the insulating material layer 103.

In one embodiment, implantation can be preformed herein so as to form the source region portion 1903 and the drain region portion 1905 in the semiconductor layer, as shown in FIG. 19B. However, it should be understood that this is not a limitation of the present disclosure.

The source region portion 1903 and the drain region portion 1905 can have the same conductivity type as that of the channel region. As for the depths of the source region portion and the drain region portion, there is no specific limitation, so long as the source region portion and the drain region portion adjoin the channel region to be formed later. In one embodiment, the depths of the source region portion and the drain region portion are substantially equal to the height of the portion of the semiconductor layer in the fin that is not covered by the first insulating material layer.

In one embodiment, after the formation of the spacer, a semiconductor layer having a certain thickness can be epitaxially grown on the exposed surface of the semiconductor layer. For example, in some embodiments, it is possible to epitaxially grow a semiconductor layer having a thickness of tens of angstroms (Å). The thickness of the epitaxially grown semiconductor layer can be set based on, for example, the width of the fin.

After the epitaxial growth, implantation can be performed to form a source region and a drain region. According to other implementations, implantation can be performed before the epitaxial growth, and in-situ doping can be performed during the process of epitaxial growth. Thus, in such a case, the source region portion and the drain region portion together with the semiconductor material portions epitaxially grown therefrom constitute the source region and the drain region. In the case where the epitaxial growth is not carried out, the source region portion 1903 and the drain region portion 1905 function as source region and drain region for the device.

In addition, it should be understood that the first channel control region in the second region adjoin the source region and the drain region (source region portion and drain region portion) and is located between the source region and the drain region (source region portion and drain region portion).

Incidentally, although a gate-last approach is employed in the illustrated embodiments, it should be understood that these embodiments are merely examples and the present disclosure is not limited to these embodiments. According to some embodiments of the present disclosure, spacer and source/drain are not formed immediately after the formation of the dummy gate. For example, a spacer can be formed after the formation of the gate, and then source region and drain region are formed.

Figure 20A:
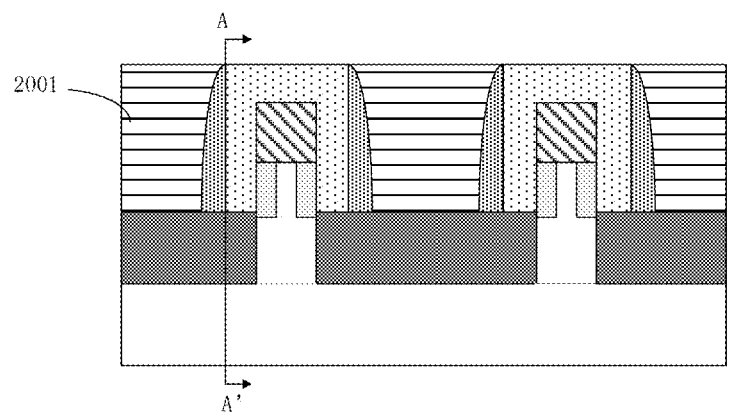
Figure 20B:
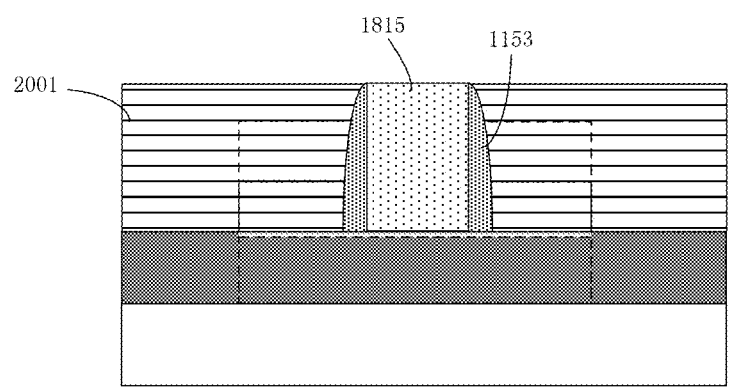

Thereafter, as shown in FIGS. 20A and 20B, an insulating material layer 2001 (second insulating material layer) is formed, to at least cover the exposed portion of the fin and expose the top of the dummy gate, and in one embodiment, also cover the spacer (if present). Herein, FIG. 20B is a sectional view taken along line A-A' of FIG. 20A and viewed from a direction indicated by the arrow.

Since fins 107 and 109 are covered by other layers, their positions are indicated by the broken lines in the figures (see FIG. 20B).

Figure 21A:
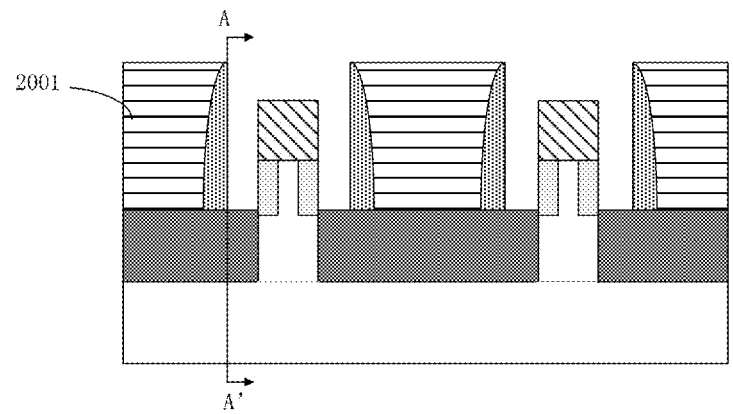
Figure 21B:
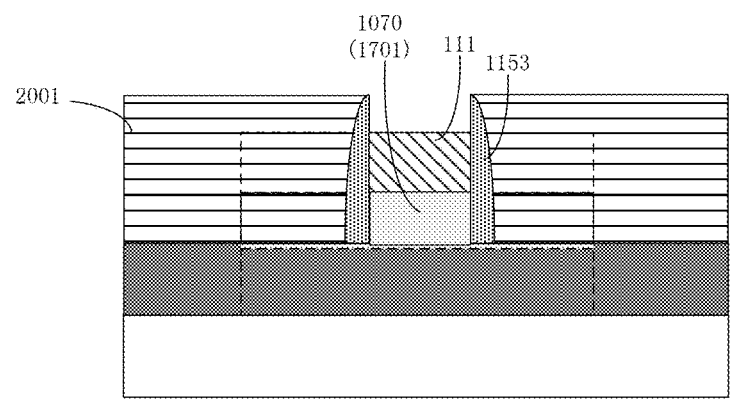

Next, as shown in FIGS. 21A and 21B, the dummy gate is removed to expose the semiconductor layer of the fin that is enclosed by the dummy gate, that is, the portion of the first region 1701 that is enclosed by the dummy gate 111 is exposed. Herein, FIG. 21B is a sectional view taken along line A-A' of FIG. 21A and viewed from a direction indicated by the arrow. The dummy gate can be removed by a wet etch method or a dry etch method, for example.

Figure 22A:
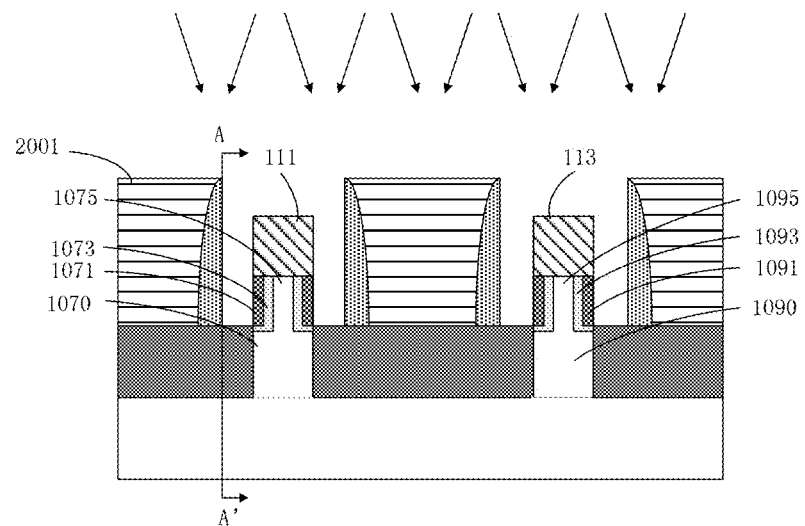
Figure 22B:
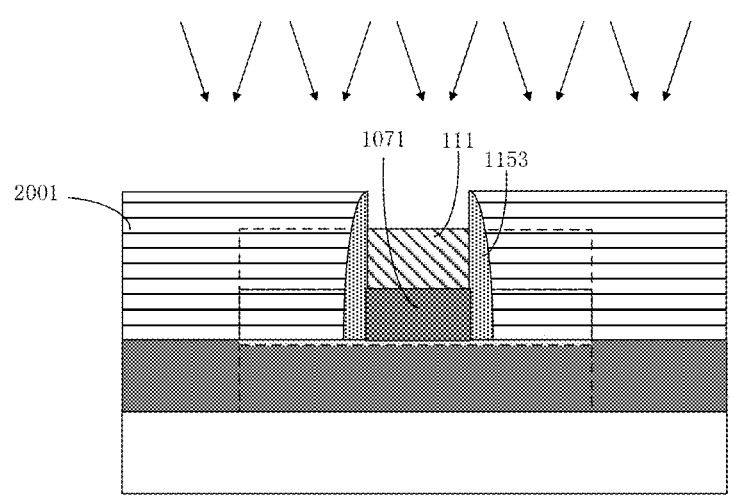

Then, as shown in FIGS. 22A and 22B, a dopant that can impart the first conductivity type is introduced into the exposed portion of the first region in the semiconductor layer (i.e. the portion that is not covered by the insulating material layer 103 and the hard mask 111/113), such that third regions 1071 and 1091 having the first conductivity type are respectively formed in the exposed surfaces of the first regions 1701 and 1703. For example, the doping can be performed by ion implantation, plasma treatment, diffusion, or the like. Herein, FIG. 22B is a sectional view taken along line A-A' of FIG. 22A and viewed along a direction indicated by the arrow.

Depending on different methods for forming the third region 1071/1091 in the exposed surface of the first region 1701/1703, the lower end of the third region 1071/1091 can extend into the first region 1701/1703 and below the upper surface of the insulating material layer 103. Likewise, in the case where the channel regions to be formed in fins 207 and 209 have different conductivity types, their respective introductions of dopant can be performed separately. For example, the first fin can be covered with a mask (for example, a resist) while dopant is introduced into the second fin; and vice versa.

Herein, the portion of the first region 1701/1703 that is between the second region 1075/1095 and the third region 1071/1091 functions as the channel region 1073/1093 which has the second conductivity type. As would be appreciated by those skilled in the art, a current path can be formed between the source region portion and the drain region portion through the channel region. Herein, the channel region 1073 separates the second region 1075 from the third region 1071. That is to say, the depth of the first region into the surface of the semiconductor layer is larger than the depth of the third region into the surface of the semiconductor layer. Moreover, the channel region 1073/1093 can have a " "-like shape, or a " "-like shape.

Herein, the third region is used as the second channel control region for controlling the channel region.

In one embodiment, ion implantation is used for introducing the dopant, and in a preferred embodiment, a tilt ion implantation is used for introducing the dopant. For example, the incident angle of the ion can be adjusted to be not perpendicular to the substrate surface.

In addition, in one embodiment, after the process such as the ion implantation and the like, an annealing (e.g., rapid annealing treatment) can be performed, so as to repair the damages caused by ion implantation.

Figure 23A:
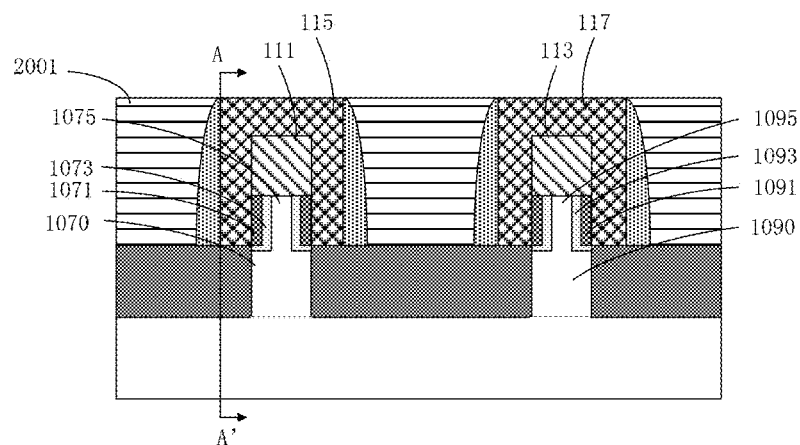
Figure 23B:
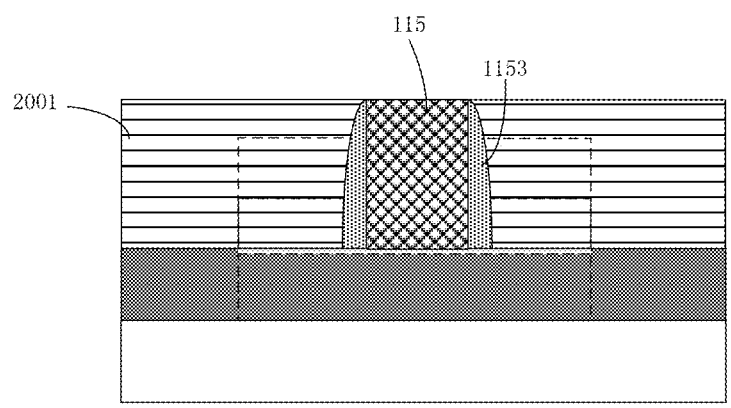

Thereafter, as shown in FIGS. 23A and 23B, gates 115 and 117 for the fins are formed, wherein the gates adjoin the second channel control regions from the outer side of the second channel control regions. The gates 115 and 117 are also formed above the insulating material layer 103.

According to different embodiments, the material for forming the gate can be doped poly-silicon, doped α-silicon (amorphous silicon), metal material, or the like. Here, FIG. 23B is a sectional view taken along line A-A' of FIG. 23A and viewed from the direction indicated by the arrow. FIG. 23B shows the spacers 1153 for the gate 115.

It would be understood by those skilled in the art that the method of the embodiments of the present disclosure can be combined with different embodiments.

In addition, it would be understood by those skilled in the art that, although a gate-last manufacturing method has been mainly described in the specification of the present disclosure, the present invention is not limited to this. For example, spacer and source/drain is not limited to being formed immediately after the formation of the dummy gate and may be before forming the gate. Instead, the second insulating material layer can be removed after the introduction of the second dopant, and thereafter, gate is formed such that it adjoins the second channel control region from outside of the second channel control region. After the formation of the gate, in one embodiment, a spacer for the gate is formed. After the formation of the spacer, similarly to the aforementioned methods, for example, a semiconductor material can be epitaxially grown from the exposed portion of the semiconductor layer; and then, source and drain implantations are carried out, so as to form a source region portion and a drain region portion in the semiconductor layer that adjoin the channel region, wherein, the source region portion and the drain region portion can have a conductivity type same as that of the channel region. Likewise, the first channel control region in the second region adjoins the source region portion and the drain region portion and is located between the source region portion and the drain region portion. Alternatively, as described above, implantation can be performed after the formation of the spacer, to form the source region portion and the drain region portion, and then in-situ epitaxial growth is performed.

It should also be understood that, as described above, in the case where the first fin and the second fin have different conductivity types of channel regions, their respective introductions of dopant can be performed separately. For example, the first fin can be covered with a mask (e.g. a hard mask, a photo resist) while dopant is introduced into the second fin; and, vice versa. In addition, as described above, in this specification, processes, components, or details not concerned by the present disclosure have not been described in detail, because such knowledge is known by those skilled in the art, or can be easily or apparently conceived based on the teachings of the present disclosure.

The embodiments of the present disclosure have been described above with reference to the drawings. It should be appreciated, however, that these embodiments are merely illustrative in nature and not intended to limit the claims of this application. The embodiments can be arbitrarily combined without departing from the spirit of the present invention. For example, the present invention is not only applicable to the advanced semiconductor logic device process, but also adaptably applied to various other processes. In addition, the embodiments and details of the present invention can be modified by one skilled in the related art in light the teachings of the invention, without departing from the scope of the present invention. Therefore, all these modifications are within the spirit and scope of the present invention as defined by the attached claims.

What is claimed is:

1. A fin semiconductor device, comprising:
   a fin including a semiconductor layer formed on a substrate;

an insulating material layer formed over the substrate and surrounding the fin, the insulating material layer having a thickness less than the thickness of the semiconductor layer;

a source region portion and a drain region portion formed on the insulating material layer; and a first channel control region, a second channel control region and a channel region between the source region portion and the drain region portion, wherein the first channel control region is at a center of the semiconductor layer away from the edge and has a first conductivity type, wherein the second channel control region is formed along an edge of the semiconductor layer in a portion of the semiconductor layer that is not covered by the insulating material layer, the second channel control region having the first conductivity type, wherein the channel region is between the first channel control region and the second channel control region, adjoining the source region portion and the drain region portion, wherein the channel region, the source region portion and the drain region portion have a second conductivity type which is opposite to the first conductivity type.

2. The semiconductor device of claim 1 further comprising:

a gate for the fin, the gate adjoining the second channel control region, wherein the gate is formed on the insulating material layer.

3. The semiconductor device of claim 1, wherein the first channel control region has a lower portion and an upper portion extending from the lower portion, wherein the lower portion is below the upper surface of the insulating material layer.

4. The semiconductor device of claim 1, wherein the fin further comprises a hard mask on the semiconductor layer.

5. The semiconductor device of claim 1, wherein a ratio of the thickness T of the insulating material layer to the difference between the height Hsemi of the semiconductor layer and the thickness T, that is, T/(Hsemi−T), is about 3-5.

6. The semiconductor device of claim 1, wherein the second channel control region extends below the upper surface of the insulating material layer.

7. The semiconductor device of claim 1, wherein the substrate further has a region adjoining the first channel control region and having a conductivity type opposite to that of the channel region, so as to provide power for the first channel control region.

8. The semiconductor device of claim 1 further comprises:

gate spacers located on two sides of the gate that are adjacent to the source region portion and the drain region portion.

9. The semiconductor device of claim 1, further comprising two or more of the fins, wherein the two or more of the fins comprise a first fin and a second fin, and wherein the conductivity type of the channel region included in the first fin is the same as or opposite to the conductivity type of the channel region included in the second fin.

* * * * *